United States Patent
Choi

(10) Patent No.: US 11,393,744 B2
(45) Date of Patent: Jul. 19, 2022

(54) METAL POWDER LAYERS BETWEEN SUBSTRATE, SEMICONDUCTOR CHIP AND CONDUCTOR

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 17/144,057

(22) Filed: Jan. 7, 2021

(65) Prior Publication Data
US 2021/0343631 A1    Nov. 4, 2021

(30) Foreign Application Priority Data

May 4, 2020    (KR) .................. 10-2020-0053229

(51) Int. Cl.
*H01L 21/00* (2006.01)
*H01L 21/44* (2006.01)
*H01L 21/302* (2006.01)
*H01L 21/31* (2006.01)
*H01L 23/495* (2006.01)
*H01L 23/00* (2006.01)

(52) U.S. Cl.
CPC .... *H01L 23/49582* (2013.01); *H01L 23/4951* (2013.01); *H01L 23/49513* (2013.01); *H01L 23/49541* (2013.01); *H01L 23/562* (2013.01); *H01L 24/05* (2013.01); *H01L 24/32* (2013.01); *H01L 24/83* (2013.01)

(58) Field of Classification Search
CPC .......... H01L 23/49582; H01L 23/4951; H01L 23/49541; H01L 23/562; H01L 23/49513; H01L 24/83; H01L 24/29; H01L 23/32; H01L 24/05

See application file for complete search history.

(56) References Cited

U.S. PATENT DOCUMENTS

| | | | |
|---|---|---|---|
| 2005/0167802 A1* | 8/2005 | Hirano | H01L 25/072 257/678 |
| 2009/0096100 A1* | 4/2009 | Kajiwara | H01L 24/81 257/741 |
| 2016/0148819 A1* | 5/2016 | Heuck | H01L 24/83 438/121 |
| 2021/0305175 A1* | 9/2021 | Abe | H01L 24/48 |

FOREIGN PATENT DOCUMENTS

| | | |
|---|---|---|
| JP | 5123633 B2 | 1/2013 |
| JP | 6269116 B2 | 1/2018 |
| KR | 10-2016-0050084 A | 5/2016 |

* cited by examiner

*Primary Examiner* — Alonzo Chambliss
(74) *Attorney, Agent, or Firm* — Park, Kim & Suh, LLC

(57) ABSTRACT

Provided is a semiconductor package in which a bonding structure is formed using metal grains included in metal powder layers having a coefficient of thermal expansion (CTE) similar with those of a substrate and a conductor so as to minimize generation of cracks and to improve reliability of bonded parts.

21 Claims, 10 Drawing Sheets

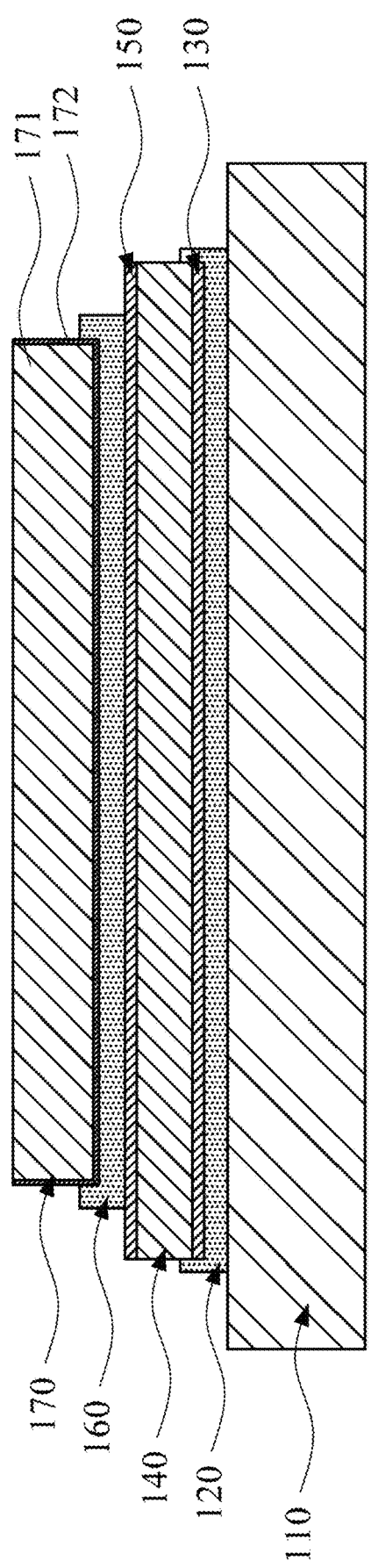

METAL POWDER LAYERS BETWEEN SUBSTRATE, SEMICONDUCTOR CHIP AND CONDUCTOR

CROSS-REFERENCE TO RELATED PATENT APPLICATION

This application claims the benefit of Korean Patent Application No. 10-2020-0053229, filed on May 4, 2020, in the Korean Intellectual Property Office, the disclosure of which is incorporated herein in its entirety by reference.

BACKGROUND OF THE INVENTION

1. Field of the Invention

The present invention relates to a semiconductor package in which a bonding structure is formed using metal grains included in metal powder layers having a coefficient of thermal expansion (CTE) similar with those of a substrate and a conductor so as to minimize generation of cracks and to improve reliability of bonded parts.

2. Description of the Related Art

In general, a semiconductor package includes a semiconductor chip formed on a substrate, a conductor which is a metal post attached on the semiconductor chip, a lead frame including Cu, and a housing molded by a sealing member. Here, the semiconductor chip is attached on a lead frame pad and a lead frame lead is electrically connected to a pad of the semiconductor chip by using a bonding wire (signal line).

The semiconductor chip is respectively attached to the substrate and the conductor by using a solder. However, cracks may be generated from bonded parts due to each different coefficient of thermal expansion (CTE) of materials.

FIG. 7 are pictures of scanning electron microscope (SEM) illustrating cracks generated in a bonding structure of a general semiconductor package using a solder. The semiconductor package repeats heating and cooling according to its operation and cracks may be generated due to a difference in CTE of each material as illustrated in the picture at the right side of FIG. 7.

That is, due to insufficient reliability of a solder 30 interposed between a substrate 10 including Cu and a semiconductor chip 20, a boded part formed of the solder 30 is cracked and thus, electrical properties may be lowered.

Accordingly, the bonding structure needs to be improved to minimize generation of cracks and to improve reliability of bonded parts.

SUMMARY OF THE INVENTION

The present invention provides a semiconductor package in which a bonding structure is formed using metal grains included in metal powder layers having a coefficient of thermal expansion (CTE) similar with those of a substrate and a conductor so as to minimize generation of cracks and to improve reliability of bonded parts.

According to an aspect of the present invention, there is provided a semiconductor package including: at least one substrate on which a specific pattern is formed to enable electrical connection; at least one semiconductor chip on the upper surface of the substrate including a lower side having a primary conductive metal layer and an upper side having a secondary conductive metal layer; a conductor including one end electrically connected to the primary conductive metal layer or the secondary conductive metal layer and at least one side of the most outer contact side plated with a conductor plated layer; at least one metal powder layer formed to contact with the primary conductive metal layer or the secondary conductive metal layer; and a package housing for exposing a terminal to the outside and packaging the substrate, the semiconductor chip, the conductor, and the metal powder layer, wherein the conductor is electrically connected to the lower side of the semiconductor chip having the primary conductive metal layer or the upper side of the semiconductor chip having the secondary conductive metal layer and thereby, electrically connected to the substrate or the terminal.

The metal powder layers may include metal powder and may be formed of primary and secondary metal powder layers, the primary metal powder layer contacting and electrically connecting to the primary conductive metal layer, and the secondary metal powder layer contacting and electrically connecting to the secondary conductive metal layer.

The metal powder forming the metal powder layers may be metal grains.

The metal grains may be formed of a single material including Ag or Cu or may contain more than 70% of at least any one from Ag, Au, Cu, and Ni.

The metal grains may have at least one air gap therebetween which is not filled with other metal materials.

The at least one air gap may have the size of 1 µm or below.

The at least one substrate may include at least one insulation layer.

The primary conductive metal layers or the secondary conductive metal layers may be formed by stacking one or more metal layer, and the metal layers may be formed of a single material including Al, Ag, Au, Pd, Ni, or Cu or an alloy containing more than 70% of at least any one from Al, Ag, Au, Pd, Ni, and Cu.

The primary conductive metal layer contacting the metal powder layers or the most outer metal layer of the secondary conductive metal layer may be formed of a single material including Ni, Ag, Au, Al, or Cu or an alloy containing 10% to above 80% of at least any one from Ni, Ag, Au, Al, and Cu.

The conductor may be formed of metal grains in a metal powder form or non-metal grains in a non-metal powder form.

The metal grains or the non-metal grains may be formed of a single material including Mo, Cu, Mn, Al, or SiC or powder mixture including the metal grains or the non-metal grains formed of at least any one from Mo, Cu, Mn, Al, and SiC.

The conductor may contain more than 70% of the powder-form metal grains having a size of 1 µm to 50 µm or more than 70% of the powder-form non-metal grains having a size of 1 µm to 50 µm.

The conductor plated layer may be formed of a single material including Ag, Au, Ni, Cu, or Sn or may be an alloy containing more than 50% of at least any one from Ag, Au, Ni, Cu, and Sn.

The conductor plated layer may be formed by stacking one or more layer.

The conductor plated layer may have a thickness of 2 µm or above.

The primary metal powder layer may be formed to cover the lower sides of the primary conductive metal layer and the semiconductor chip and may be attached to the side of the semiconductor chip at a height of above 5 μm.

The secondary metal powder layer may be formed to cover the lower side of the conductor and may be attached to the side of the conductor at a height of above 5 μm.

The metal powder layers may include the primary metal powder layer where the metal grains contact the primary conductive metal layer on the lower side of at least one semiconductor chip, or the secondary metal powder layer where the metal grains contact the secondary conductive metal layer on the upper side of at least one semiconductor chip.

The metal grains may be formed to have each different diameter in width and length.

The metal grains having a shorter diameter of below 2 μm among the diameters in width and length may occupy more than 20% of total number of metal grains.

BRIEF DESCRIPTION OF THE DRAWINGS

The above and other features and advantages of the present invention will become more apparent by describing in detail exemplary embodiments thereof with reference to the attached drawings in which:

FIG. 2 is a cross-sectional view of a bonded part separated from the semiconductor package of FIGS. 1A to 1C;

DETAILED DESCRIPTION OF THE INVENTION

Figure 1A:
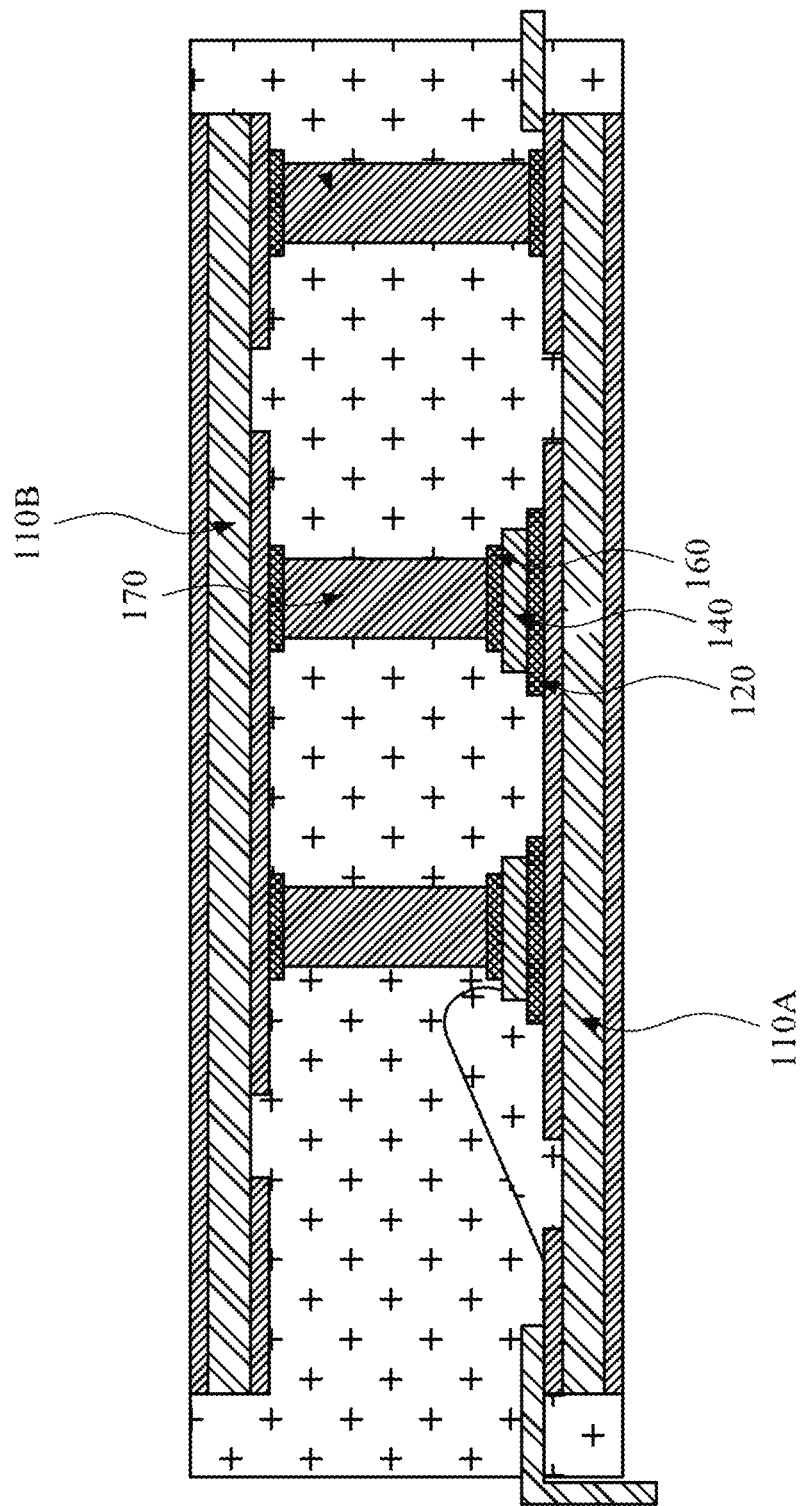
FIGS. 1A to 1C are cross-sectional views of a semiconductor package according to an embodiment of the present invention.

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

In the present invention, a semiconductor package includes at least one substrate on which a specific pattern is formed, at least one semiconductor chip on the upper surface of the substrate including a lower side having a primary conductive metal layer and an upper side having a secondary conductive metal layer, a conductor including one end electrically connected to the primary conductive metal layer or the secondary conductive metal layer and at least one side of the most outer contact side plated with a conductor plated layer, at least one metal powder layer formed to contact with the primary conductive metal layer or the secondary conductive metal layer, and a package housing for exposing a terminal to the outside and packaging the substrate, the semiconductor chip, the conductor, and the metal powder layer. The conductor is electrically connected to the lower side of the semiconductor chip having the primary conductive metal layer or the upper side of the semiconductor chip having the secondary conductive metal layer and thereby, electrically connected to the substrate or the terminal.

Referring to FIGS. 1A through 6, the semiconductor package according to an embodiment of the present invention includes a substrate 110 on which a specific pattern is formed, a semiconductor chip 140 on the upper surface of the substrate 110 including a lower side having a primary conductive metal layer 130 and an upper side having a secondary conductive metal layer 150, a conductor 170 including one end electrically connected to the primary conductive metal layer 130 or the secondary conductive metal layer 150, other end electrically connected to a terminal, and at least one side of the most outer contact side plated with a conductor plated layer 172, metal powder layers 120 and 160 formed to contact with the primary conductive metal layer 130 formed on the lower side of the semiconductor chip 140 or the secondary conductive metal layer 150 formed on the upper side of the semiconductor chip 140, and a package housing for exposing a terminal to the outside and packaging the substrate 110, the semiconductor chip 140, the conductor 170, and the metal powder layers 120 and 160. The conductor 170 is electrically connected to the lower side of the semiconductor chip 140 having the primary conductive metal layer 130 or the upper side of the semiconductor chip 140 having the secondary conductive metal layer 150.

Here, the metal powder layers include metal grains and are formed of the primary metal powder layer 120 and the secondary metal powder layer 160, wherein the primary metal powder layer 120 contacts and electrically connects to the primary conductive metal layer 130 and the secondary metal powder layer 160 contacts and electrically connects to the secondary conductive metal layer 150. Accordingly, a bonding structure is formed using the metal powder layers 120 and 160 which have similar coefficient of thermal expansion (CTE) with those of the substrate 110 and the conductor 170 and thus, reliability of bonded parts may be improved.

More specifically, the metal powder layers include the primary metal powder layer 120 where the metal grains contact with the primary conductive metal layer 130 formed on the lower side of at least one semiconductor chip 140, and the secondary metal powder layer 160 where the metal grains contact with the secondary conductive metal layer 150 formed on the upper side of at least one semiconductor chip 140.

Firstly, at least one substrate 110 includes at least one insulation layer and a specific pattern divided thereon to electrically connect to the semiconductor chip 140.

For example, the substrate 110 includes the insulation layer and may be an insulation substrate having a single-layer structure or a metal insulation substrate having a multi-layer structure where one or more metal pattern layers are formed. The metal pattern layers may include a single metal such as Cu or Al or a metal conductor including an alloy of Al and Cu.

Figure 1B:
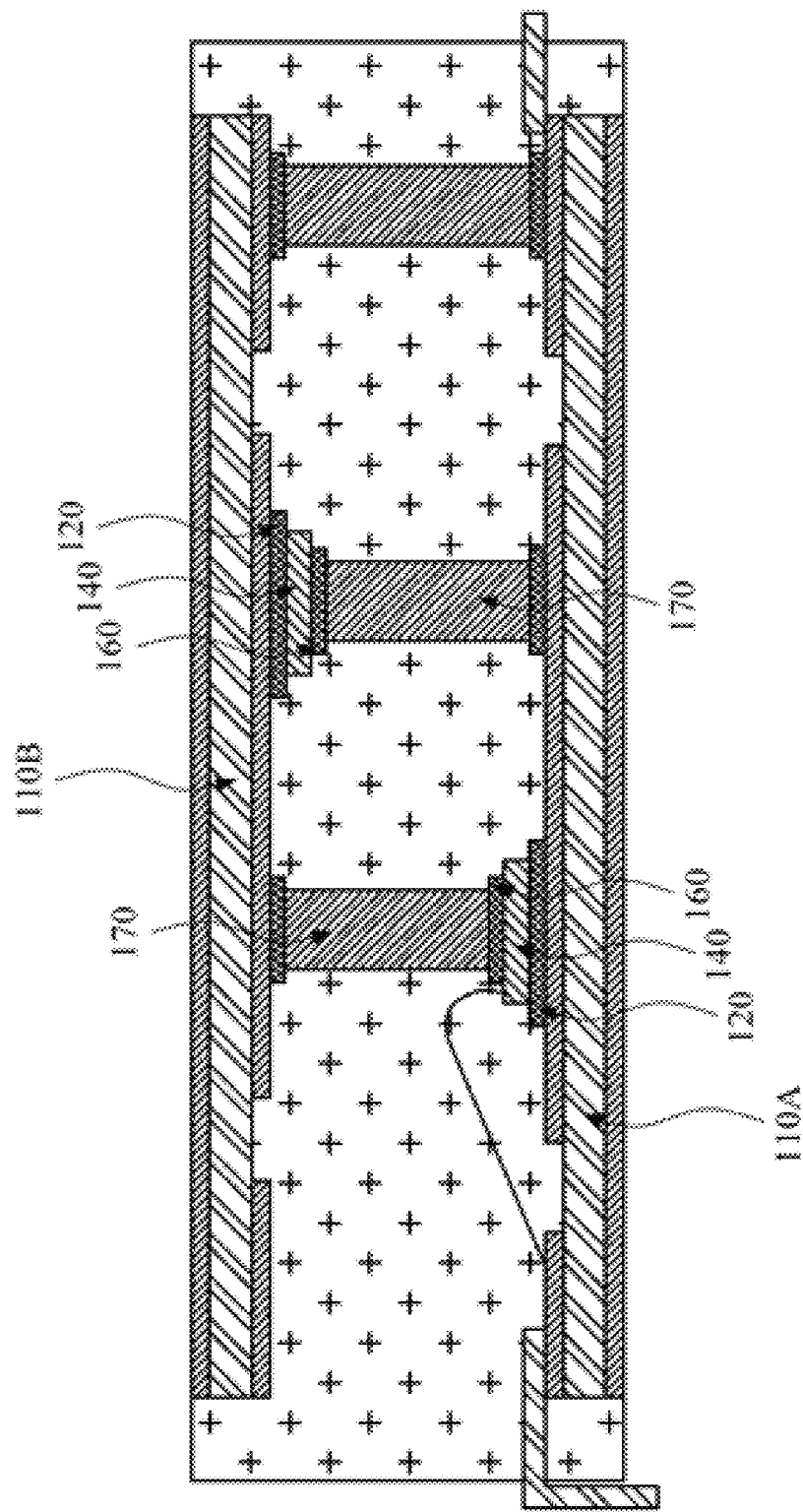
Figure 1C:
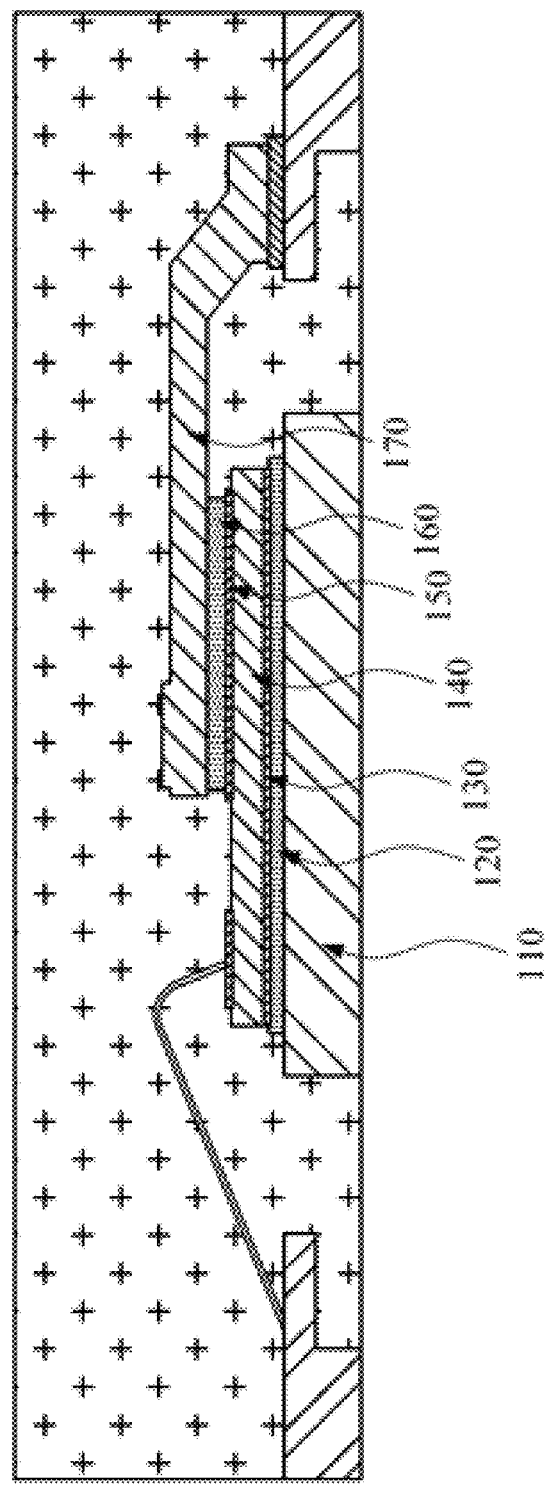

As illustrated in FIG. 1A, at least one semiconductor chip 140 is bonded on a lower metal insulation substrate 110A by using the primary metal powder layer 120 interposed therebetween, the conductor 170, which is a metal post, is bonded on the semiconductor chip 140 by using the secondary metal powder layer 160 interposed therebetween, and an upper metal insulation substrate 110B is attached to the conductor 170. Accordingly, the semiconductor package is formed in a both-sided substrate package structure where the semiconductor chip 140 is attached to the substrate only at one side. Also, as illustrated in FIG. 1B, the semiconductor chip 140 is bonded on the lower metal insulation substrate 110A by using the primary metal powder layer 120 interposed therebetween, the conductor 170 is bonded on the semiconductor chip 140 by using the secondary metal powder layer 160 interposed therebetween, the semiconductor chip 140 is bonded on the upper metal insulation substrate 110B by using the primary metal powder layer 120 interposed therebetween, and the conductor 170 is attached on the semiconductor chip 140 by using the secondary metal powder layer 160. Accordingly, the semiconductor package is formed in a both-sided substrate package structure where the semiconductor chip 140 is alternately attached to substrates at both sides. In addition, as illustrated in FIG. 10, the primary metal powder layer 120, the primary conductive metal layer 130 at the lower side of the semiconductor chip 140, and the semiconductor chip 140 are stacked in consecutive order on the substrate 110. Then, the secondary conductive metal layer 150, the secondary metal powder layer 160, and the conductor 170 are stacked in consecutive order on the semiconductor chip 140. Accordingly, the semiconductor package may be formed in a bonding structure which is a Quad Flat Non-lead (QFN) package structure.

That is, the primary metal powder layer 120 and the secondary metal powder layer 160 which will be described later may be all applied to the both-sided substrate package structure and the QFN package structure described above.

Next, since the primary metal powder layer 120 is a bonding layer, the primary metal powder layer 120 is coated and stacked on the pattern of the substrate 110 and is used to electrically connect the substrate 110 to the primary conductive metal layer 130 disposed on the lower side of the semiconductor chip 140. Accordingly, the primary metal powder layer 120 bonds the semiconductor chip 140 on the substrate 110.

Figure 4:
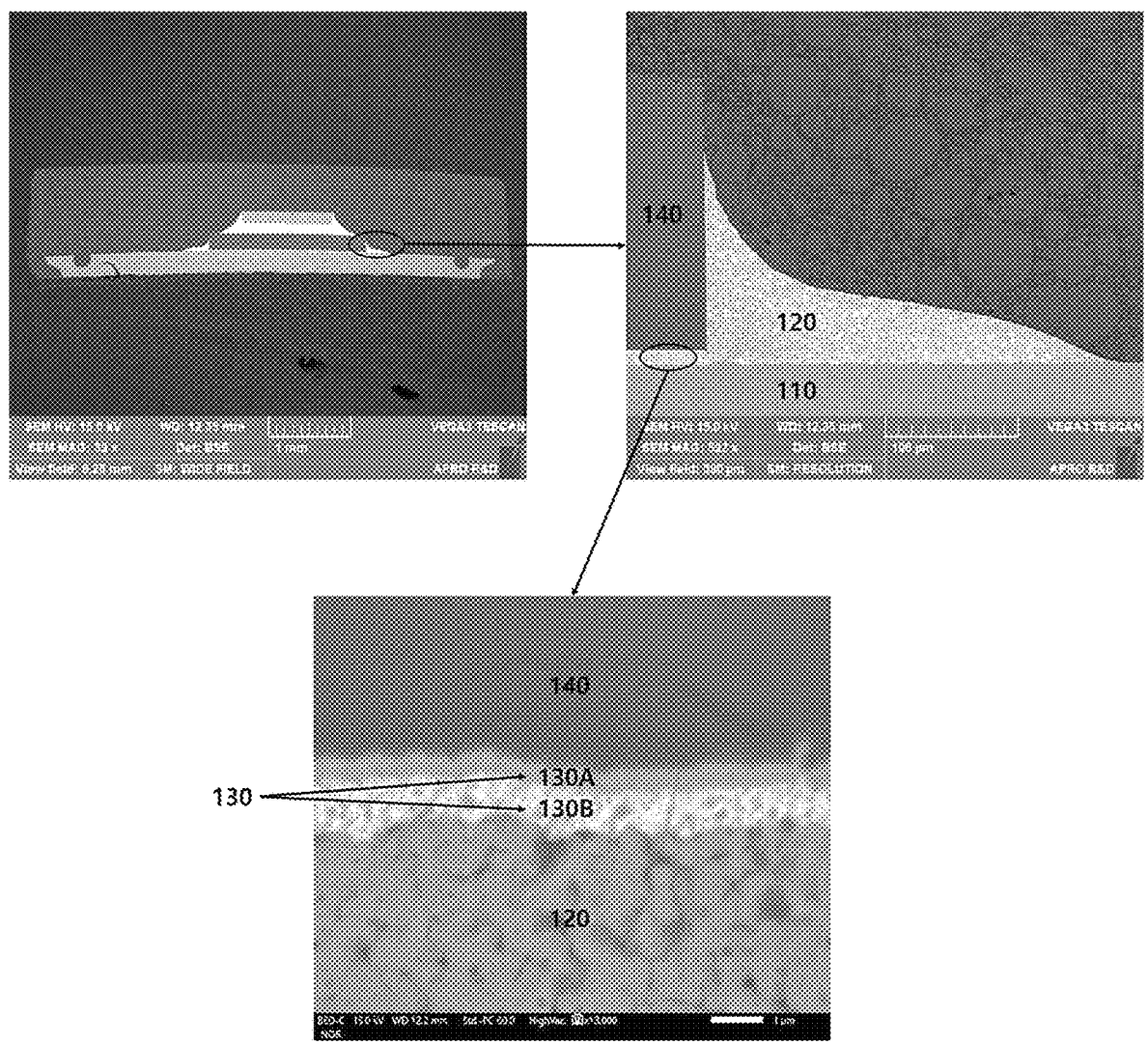
FIG. 4 is a picture of SEM illustrating a cross-sectional structure of the semiconductor package of FIG. 2.
Figure 6:
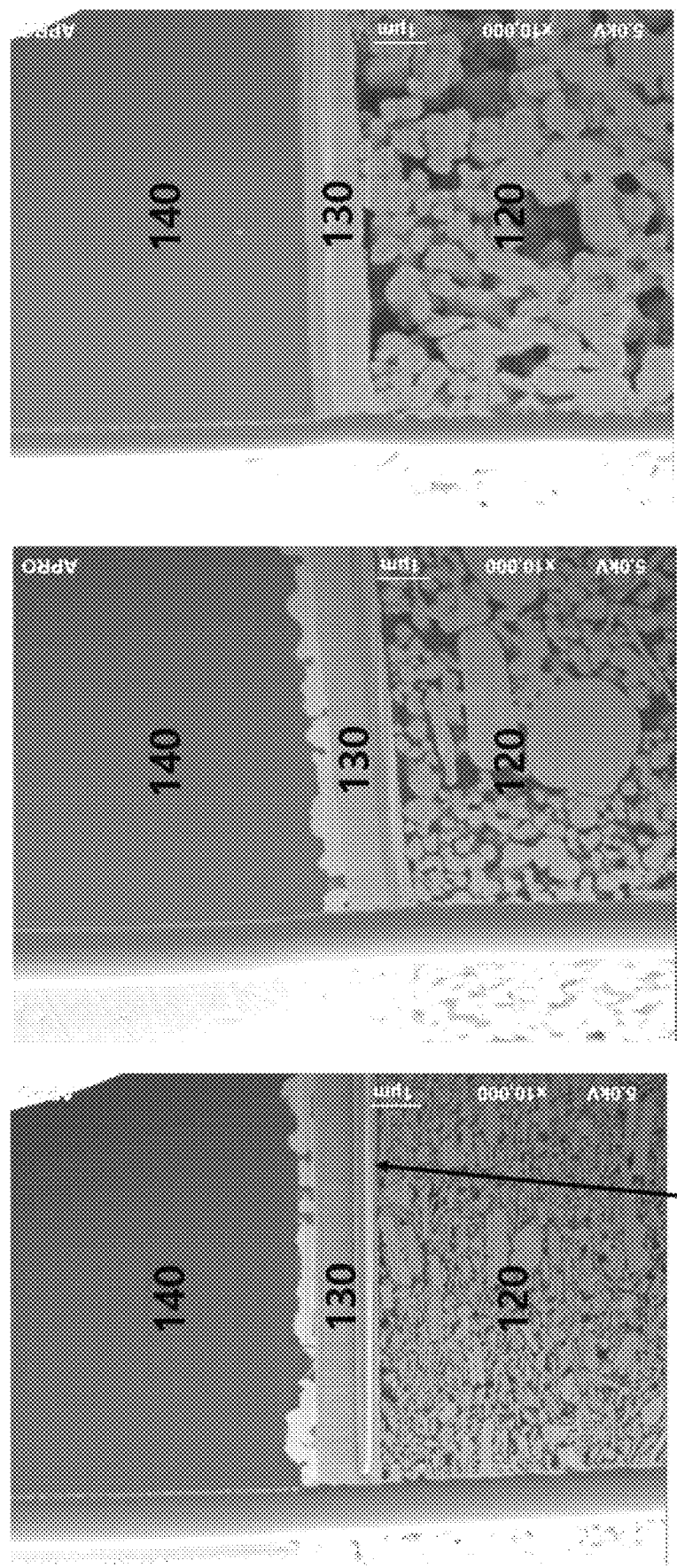
FIG. 6 is an FIB picture illustrating a bonding structure between a semiconductor chip and a metal powder layer included in the semiconductor package of FIG. 2.
Figure 7:
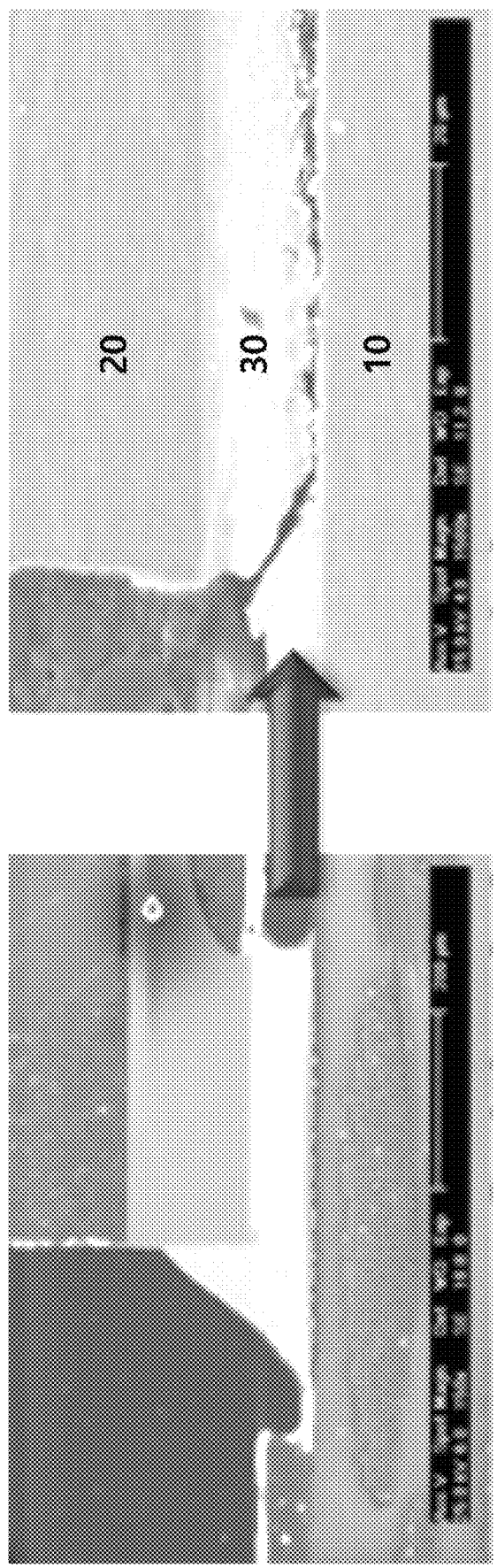
FIG. 7 is a picture of SEM illustrating cracks generated in a bonding structure of a general semiconductor package using a solder.

Referring to FIGS. 4 and 6, the primary metal powder layer 120 is formed to cover the lower sides and sides of the primary conductive metal layer 130 and the semiconductor chip 140 and is attached to the side of the semiconductor chip 140 at a height of above 5 μm. Thus, the bonding strength may be increased.

Also, at least one primary conductive metal layer 130 may contact at least one primary metal powder layer 120.

Next, as illustrated in FIG. 6, the primary conductive metal layer 130 disposed on the lower side of the semiconductor chip 140 is stacked on the primary metal powder layer 120 and is used to electrically connect the primary metal powder layer 120 to the semiconductor chip 140.

Referring to FIG. 4, the primary conductive metal layer 130 may be formed in a two-layered 130A and 130B stack structure including each different metal.

Next, the semiconductor chip 140 is attached and bonded on the primary conductive metal layer 130 and is electrically connected to the substrate 110.

The most outer metal layer of the upper and lower sides of the semiconductor chip 140 which contact the primary metal powder layer 120 or the secondary metal powder layer 160 may be formed of a single material including Ni, Ag, Au, Al, or Cu or an alloy containing 10% to above 80% of any one of the materials.

Here, the semiconductor chip 140 may include a silicon control rectifier (SCR), a power transistor, an insulated gate bipolar transistor (IGBT), a metal-oxide semiconductor filed effect transistor (MOSFET), a power rectifier, a power regulator, or a power semiconductor including a combination thereof and may be used in electric cars, hydrogen powered electric cars, inverters, or converters.

The secondary conductive metal layer 150 is attached and bonded on the semiconductor chip 140 and is used to electrically connect the semiconductor chip 140 to the secondary metal powder layer 160.

Here, the primary conductive metal layer 130 or the secondary conductive metal layer 150 may be formed of a single material including Al, Ag, Au, Pd, Ni, or Cu or an alloy containing more than 70% of Al, Ag, Au, Pd, Ni, and/or Cu. The primary conductive metal layer 130 or the secondary conductive metal layer 150 may be formed by stacking at least one metal layer.

Next, since the secondary metal powder layer 160 is a bonding layer, the secondary metal powder layer 160 is coated and stacked on the secondary conductive metal layer 150 and is used to electrically connect the secondary conductive metal layer 150 to the conductor 170. Accordingly, the secondary metal powder layer 160 bonds the conductor 170 on the semiconductor chip 140.

Also, at least one secondary conductive metal layer 150 may contact at least one secondary metal powder layer 160.

Figure 3:
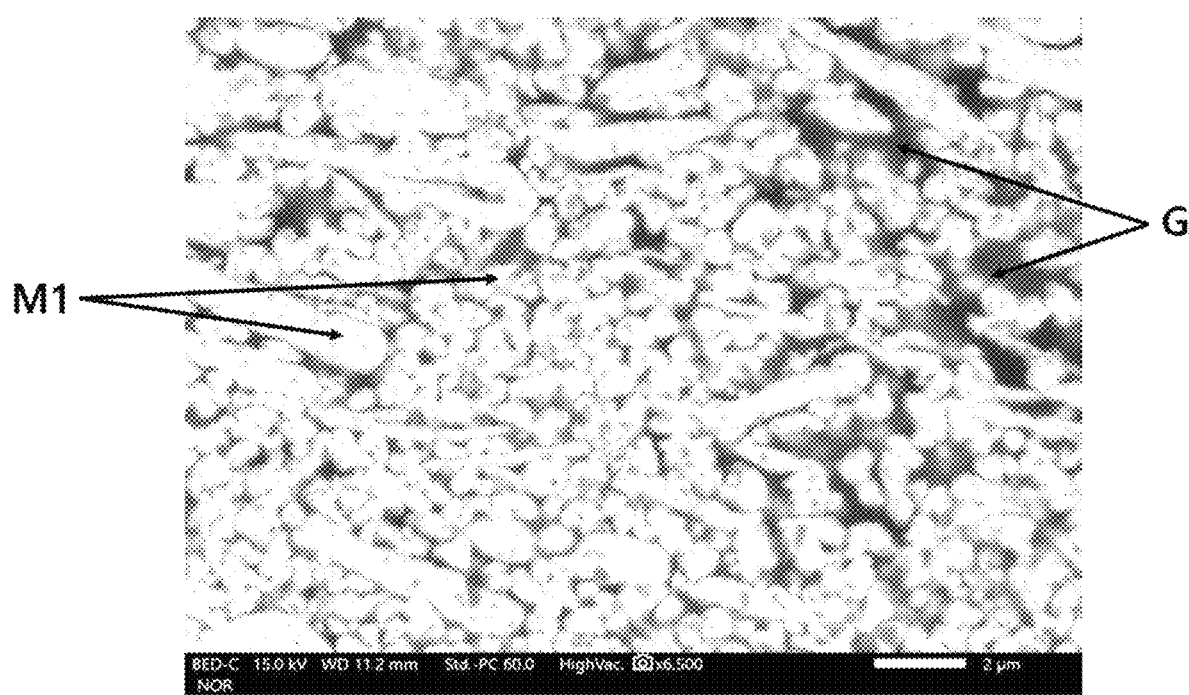
FIG. 3 is a picture of scanning electron microscope (SEM) illustrating a metal powder layer of the semiconductor package of FIG. 2.

Here, referring to FIG. 3, metal powders included in the primary metal powder layer 120 or the secondary metal powder layer 160 may be metal grains M1 and may be formed of a single material including Mo, Cu, Mn, Al, or SiC having a CTE of 17 ppm to 18 ppm or powder mixture including metal grains formed of Mo, Cu, Mn, Al, and/or SiC. The primary metal powder layer 120 or the secondary metal powder layer 160 may have CTEs similar with and the conductor 170 and the substrate 110 mostly containing Cu, so as to minimize generation of cracks occurring due to a difference in CTEs by each material while operating of the semiconductor package.

Also, at least one air gap G, which is a micrometer-sized gap and is not filled with other metal materials, may exist between the metal grains M1. The size of the air gap G may be 1 μm or below and at least one air gap G is formed to minimize a change in properties of thermal expansion. Therefore, a stable bonding structure may be formed.

In addition, the metal grains M1 are formed to have each different diameter in width and length and the metal grains having a shorter diameter of below 2 μm among the diameters in width and length may occupy more than 20% of total number of metal grains.

Figure 5A:
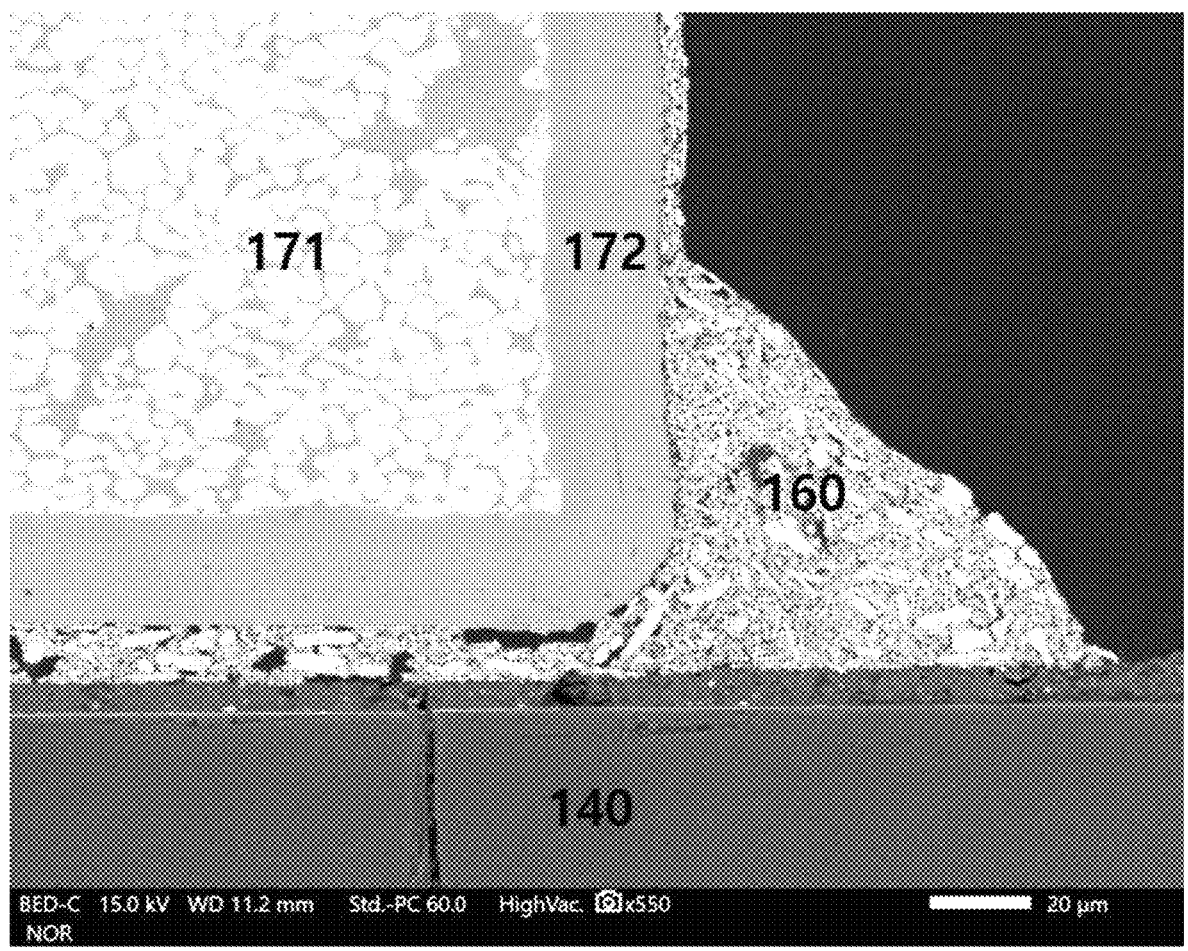
FIGS. 5A and 5B are pictures of SEM illustrating a bonding structure between a semiconductor chip and a conductor included in the semiconductor package of FIG. 2.

Referring to FIG. 5A, the secondary metal powder layer 160 is formed to cover the lower side and the side of the conductor 170 and is attached to the side of the conductor 170 at a height of above 5 μm. Thus, the bonding strength may be increased.

Next, the conductor 170 is used to electrically connect the semiconductor chip 140 to a terminal (not illustrated). One end of the conductor 170 is electrically connected to the secondary conductive metal layer 150 by using the secondary metal powder layer 160 interposed therebetween and the other end of the conductor 170 is electrically connected to the terminal. Also, at least one side of the most outer contact side is plated with the conductor plated layer 172.

Figure 5B:
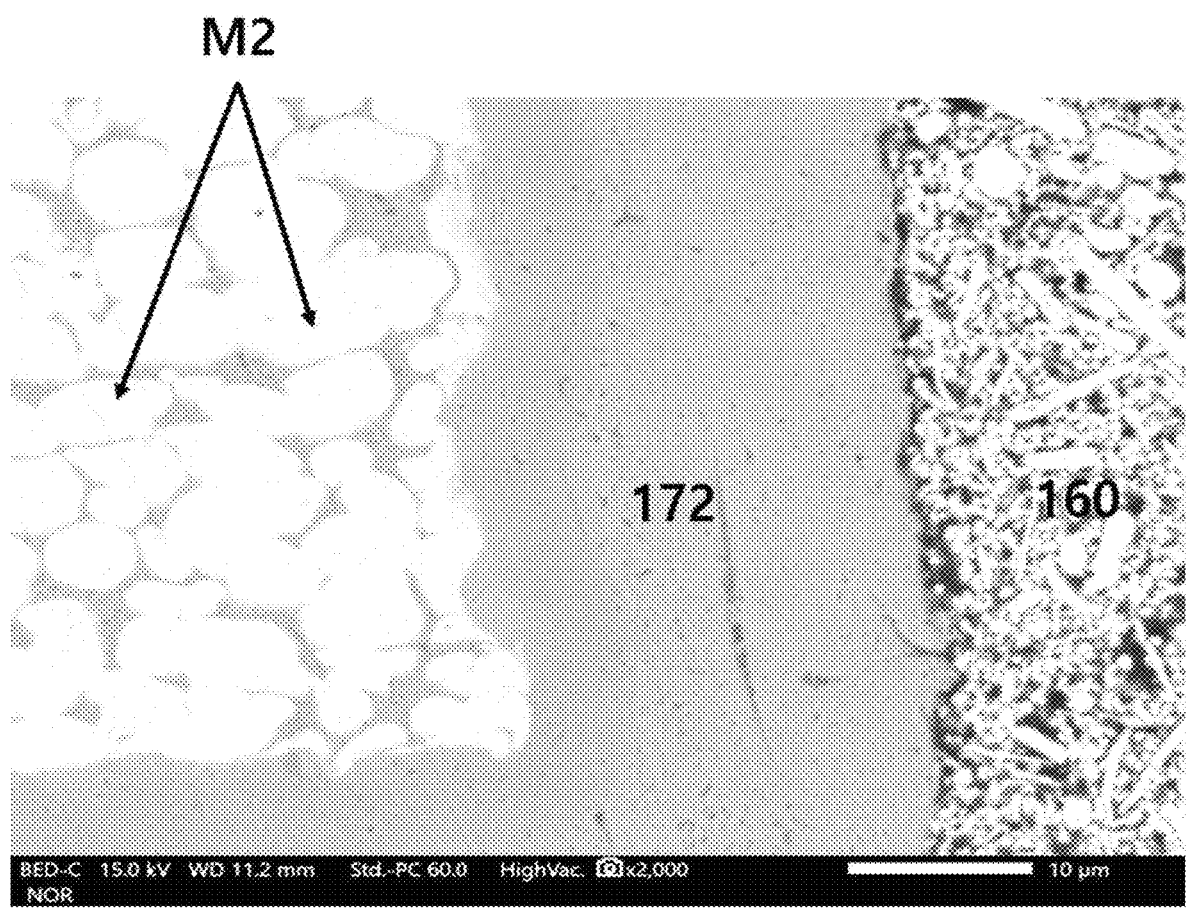

Referring to FIG. 5B, the conductor 170 is formed of metal grains M2, which is in a powder form. The metal grains M2 may be formed of a single material including Mo, Cu, Mn, Al, or SiC or powder mixture including metal grains formed of Mo, Cu, Mn, Al, and/or SiC.

Also, the conductor 170 may contain more than 70% of the powder-form metal grains M2 having a size of 1 μm to 50 μm.

As described above, the conductor 170 is formed of powder-form metal grains. However, the present invention is not limited thereto and the conductor 170 may be formed of non-metal grains in a non-metal powder-form. Here, the non-metal grains may be formed of a single material including Mo, Cu, Mn, Al, or SiC or powder mixture including the non-metal grains formed of Mo, Cu, Mn, Al, and/or SiC. Also, the conductor 170 may contain more than 70% of the powder-form non-metal grains having a size of 1 μm to 50 μm.

As compared with FIGS. 2 and 5A, the conductor 170 may include a main metal layer 171 and the conductor plated layer 172 which form the structure of the conductor 170, wherein the conductor plated layer 172 is formed of a metal different from that of the main metal layer 171, is plated on at least one side of the most outer contact side contacting the secondary metal powder layer 160, is formed by stacking one or more layer, and may have a thickness of 2 μm or above.

Also, the conductor plated layer 172 is formed of a light metal material having excellent electrical conductivity and is a functional layer used to improve electrical connection with the secondary conductive metal layer 150. A thickness of the conductor plated layer 172 may be relatively thinner than that of the main metal layer 171. The main metal layer 171 and the conductor plated layer 172, which are separately formed, may be compressed to form a single body. Also, the main metal layer 171 may be plated with the conductor plated layer 172 to form a single body.

Here, when the main metal layer 171 is plated with the conductor plated layer 172, a bonding layer (not illustrated) used in bonding may be interposed between the main metal layer 171 and the conductor plated layer 172 to smoothly perform a plating process.

Also, the conductor plated layer 172 may be formed of a single material including Ag, Au, Ni, Cu, or Sn or may be an alloy containing more than 50% of Ag, Au, Ni, Cu, and/or Sn.

The final package housing packages the substrate 110, the semiconductor chip 140, the conductor 170, and the terminal using an Epoxy Molding Compound (EMC), PolyPhenylene Sulfide (PPS), or PolyButylene Terephtalate (PBT) so as to be insulated and protected.

Accordingly, the substrate 110 and the primary conductive metal layer 130 are electrically connected to each other using metal powder of the primary metal powder layer 120 and the secondary conductive metal layer 150 and the conductor 170 are electrically connected to each other using metal powder of the secondary metal powder layer 160. Thus, a bonding structure is formed using the metal powder layers 120 and 160 which have CTEs similar with those of the substrate 110 and the conductor 170 and thereby, generation of cracks occurring due to a difference in CTE by each material may be minimized in the bonding structure using a solder.

That is, the bonding structure is formed using the metal grains M1 included in the metal powder layers 120 and 160 that have a lower CTE than that of the solder, and have CTEs similar with the conductor 170 and the substrate 110 mostly containing Cu. Accordingly, cracks generated between the substrate 110 and the primary conductive metal layer 130 and between the secondary conductive metal layer 150 and the conductor 170 may be minimized to improve reliability of bonded parts.

According to the present invention, compared with a general bonding structure of a semiconductor package using a solder, the bonding structure is formed using the metal grains included in the metal powder layers that have CTEs similar with the conductor and the substrate mostly containing Cu and thereby, cracks generated between the substrate and the primary conductive metal layer and between the secondary conductive metal layer and the conductor may be minimized to improve reliability of bonded parts.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   at least one substrate on which a specific pattern is formed to enable electrical connection;
   at least one semiconductor chip on the upper surface of the substrate comprising a lower side having a primary conductive metal layer and an upper side having a secondary conductive metal layer;
   a conductor comprising one end electrically connected to the primary conductive metal layer or the secondary conductive metal layer, wherein the conductor includes a main metal layer and a conductor plated layer plating at least one of most outer contact sides of the main metal layer, and materials of the main metal layer and the conductor plated layer are different from each other;
   at least one metal powder layer formed to contact with the primary conductive metal layer or the secondary conductive metal layer; and
   a package housing for exposing a terminal to the outside and packaging the substrate, the semiconductor chip, the conductor, and the metal powder layer,
   wherein the conductor is electrically connected to the lower side of the semiconductor chip having the primary conductive metal layer or the upper side of the semiconductor chip having the secondary conductive metal layer and thereby, electrically connected to the substrate or the terminal,
   wherein the main metal layer included in the conductor is formed of metal grains in a metal powder form or non-metal grains in a non-metal powder form.

2. The semiconductor package of claim 1, wherein the metal powder layers comprise metal powder and are formed of primary and secondary metal powder layers, the primary metal powder layer contacting and electrically connecting to the primary conductive metal layer, and the secondary metal powder layer contacting and electrically connecting to the secondary conductive metal layer.

3. The semiconductor package of claim 2, wherein the primary metal powder layer is formed to cover the lower sides of the primary conductive metal layer and the semiconductor chip and is attached to the side of the semiconductor chip at a height of above 5 μm.

4. The semiconductor package of claim 2, wherein the secondary metal powder layer is formed to cover the lower side of the conductor and is attached to the side of the conductor at a height of above 5 μm.

5. The semiconductor package of claim 1, wherein the metal powder forming the metal powder layers is metal grains.

6. The semiconductor package of claim 5, wherein the metal grains are formed of a single material comprising Ag or Cu or contain more than 70% of at least any one from Ag, Au, Cu, and Ni.

7. The semiconductor package of claim 5, wherein the metal grains have at least one air gap therebetween which is not filled with other metal materials.

8. The semiconductor package of claim 7, wherein the at least one air gap have the size of 1 μm or below.

9. The semiconductor package of claim 5, wherein the metal powder layers comprise the primary metal powder layer where the metal grains contact the primary conductive metal layer on the lower side of at least one semiconductor chip, or the secondary metal powder layer where the metal grains contact the secondary conductive metal layer on the upper side of at least one semiconductor chip.

10. The semiconductor package of claim 5, wherein the metal grains are formed to have each different diameter in width and length.

11. The semiconductor package of claim 10, wherein the metal grains having a shorter diameter of below 2 μm among the diameters in width and length occupy more than 20% of total number of metal grains.

12. The semiconductor package of claim 1, wherein the at least one substrate comprises at least one insulation layer.

13. The semiconductor package of claim 1, wherein the primary conductive metal layers or the secondary conductive metal layers are formed by stacking one or more layer, and the metal layers are formed of a single material comprising Al, Ag, Au, Pd, Ni, or Cu or an alloy containing more than 70% of at least any one from Al, Ag, Au, Pd, Ni, and Cu.

14. The semiconductor package of claim 13, wherein the primary conductive metal layer contacting the metal powder layers or the most outer metal layer of the secondary conductive metal layer is formed of a single material comprising Ni, Ag, Au, Al, or Cu or an alloy containing 10% to above 80% of at least any one from Ni, Ag, Au, Al, and Cu.

15. The semiconductor package of claim 1, wherein the metal grains or the non-metal grains are formed of a single material comprising Mo, Cu, Mn, Al, or SiC or powder mixture comprising the metal grains or the non-metal grains formed of at least any one from Mo, Cu, Mn, Al, and SiC.

16. The semiconductor package of claim 1, wherein the conductor contains more than 70% of the powder-form metal grains having a size of 1 μm to 50 μm or more than 70% of the powder-form non-metal grains having a size of 1 μm to 50 μm.

17. The semiconductor package of claim 1, wherein the conductor plated layer is formed of a single material comprising Ag, Au, Ni, Cu, or Sn or is an alloy containing more than 50% of at least any one from Ag, Au, Ni, Cu, and Sn.

18. The semiconductor package of claim 1, wherein the conductor plated layer is formed by stacking one or more layer.

19. The semiconductor package of claim 18, wherein the conductor plated layer has a thickness of 2 μm or above.

20. A semiconductor package comprising:
a lower substrate on which a first pattern is formed to enable electrical connection;
an upper substrate on which a second pattern is formed to enable electrical connection;
a first primary metal powder layer provided on an upper surface of the lower substrate;
a first semiconductor chip provided on an upper surface of the first primary metal powder layer;
a first secondary metal powder layer provided on an upper surface of the first semiconductor chip; and
a first metal post provided between the upper substrate and the first secondary metal powder layer.

21. The semiconductor package of claim 20, further comprising:
a second primary metal powder layer provided on a lower surface of the upper substrate;
a second semiconductor chip provided on a lower surface of the second primary metal powder layer;
a second secondary metal powder layer provided on a lower surface of the second semiconductor chip; and
a second metal post provided between the second secondary metal powder layer and the lower substrate.

* * * * *